(12) United States Patent
Chen et al.

(10) Patent No.: US 10,928,142 B2
(45) Date of Patent: Feb. 23, 2021

(54) WATER-COOLING HEAD

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 172 days.

(21) Appl. No.: 16/124,671

(22) Filed: Sep. 7, 2018

(65) Prior Publication Data

US 2019/0339026 A1     Nov. 7, 2019

Related U.S. Application Data

(60) Provisional application No. 62/666,733, filed on May 4, 2018.

(30) Foreign Application Priority Data

Aug. 3, 2018   (TW) .................................. 107127123

(51) Int. Cl.
| | |
|---|---|
| *F28F 3/12* | (2006.01) |
| *F04D 1/04* | (2006.01) |
| *F04D 29/20* | (2006.01) |
| *F04D 29/24* | (2006.01) |
| *F28F 9/02* | (2006.01) |
| *F28D 1/02* | (2006.01) |

(Continued)

(52) U.S. Cl.
CPC ................. *F28F 3/12* (2013.01); *F04D 1/04* (2013.01); *F04D 29/20* (2013.01); *F04D 29/24* (2013.01); *F28F 9/0246* (2013.01); *F04D 29/266* (2013.01); *F04D 29/5893* (2013.01); *F28D 1/0233* (2013.01); *F28D 2001/0253* (2013.01); *F28F 2250/08* (2013.01); *H05K 7/20218* (2013.01); *H05K 7/20263* (2013.01); *H05K 7/20272* (2013.01)

(58) Field of Classification Search
CPC ......... H05K 7/202263; H05K 7/20272; H05K 7/20218; F28D 1/0233; F28D 2001/0253; F04D 29/5893; F04D 29/266; F04D 29/24; F04D 29/20
USPC ............................................. 165/80.5, 104.33
See application file for complete search history.

(56) References Cited

U.S. PATENT DOCUMENTS

| | | | |
|---|---|---|---|
| 7,325,591 B2 * | 2/2008 | Duan ..................... | H01L 23/473 165/104.33 |
| 2017/0184116 A1 * | 6/2017 | Guo ....................... | F04D 29/086 |
| 2017/0218970 A1 * | 8/2017 | Ahlroth ................... | F04D 29/24 |

* cited by examiner

*Primary Examiner* — Joel M Attey
(74) *Attorney, Agent, or Firm* — WPAT, PC

(57) ABSTRACT

A water-cooling head includes a casing, a base, an input channel, an output channel and a pump. An active space is defined by the base and the casing collaboratively. A working medium is filled in the active space. The heat absorbed by the base is transferred to the working medium. The input channel is in communication with the active space. The cooled working medium is introduced into the active space through the input channel. The output channel is in communication with the active space. The heated working medium is outputted from the active space through the output channel. The pump is installed on the casing, and includes an impeller. The impeller is disposed within the active space and located near the output channel. The impeller is driven to guide the working medium to be outputted from the active space through the output channel.

25 Claims, 11 Drawing Sheets

(51) Int. Cl.
*H05K 7/20* (2006.01)
*F04D 29/26* (2006.01)
*F04D 29/58* (2006.01)

ically designed to inhale and guide the working medium # WATER-COOLING HEAD

CROSS-REFERENCE TO RELATED APPLICATION

This application claims priority to U.S. Provisional Patent Application No. 62/666,733 filed Mar. 4, 2018, the contents of which are incorporated herein by reference.

FIELD OF THE INVENTION

The present invention relates to a heat dissipation module, and more particularly to a water-cooling head.

BACKGROUND OF THE INVENTION

Nowadays, a water-cooling head with a built-in pump has been introduced into the market. However, it is difficult to flow the working medium by using the impeller of the pump only. For stably transferring the working medium along a one-direction circular loop, the casing or the inner structure of the water-cooling head is equipped with plural guiding structures for assisting the impeller of the pump. For example, in U.S. Pat. No. 8,245,764, an impeller cover, an intermediate member and the connected passages are used as the guiding structures of the water-cooling head to separate the inner portion of the water-cooling head into two independent chambers. Consequently, the working medium can be stably transferred along the one-direction circular loop. However, too many guiding structures may increase the structural complexity of the water-cooling head, occupy the inner space of the water-cooling head and increase the fabricating cost. Moreover, since the inner space of the water-cooling head is largely occupied by the guiding structures, the overall height of the water-cooling head cannot be reduced.

Therefore, there is a need of providing a water-cooling head with the simplified constituents. Consequently, only the inherent structure of the impeller of the pump is able to guide the working medium along the one-direction circular loop in order to meet the requirements of the industries.

SUMMARY OF THE INVENTION

For solving the drawbacks of the conventional technologies, the present invention provides a water-cooling head. The structure of an impeller of the water-cooling head is specially designed to inhale and guide the working medium within an active space to flow. Consequently, the internal structure of the water-cooling head is simplified, the volume of the water-cooling head is reduced, and the heat dissipating performance of the water-cooling head is enhanced.

In accordance with an aspect of the present invention, there is provided a water-cooling head. The water-cooling head includes a casing, a base, an input channel, an output channel and a pump. An active space is defined by the base and the casing collaboratively. A working medium is filled in the active space. The heat absorbed by the base is transferred to the working medium. The input channel is in communication with the active space. After the working medium is cooled, the working medium is introduced into the active space through the input channel. The output channel is in communication with the active space. After the working medium absorbs the heat, the working medium is outputted from the active space through the output channel. The pump is installed on the casing, and includes an impeller. The impeller is disposed within the active space and located near the output channel. The impeller is driven to guide the working medium to be outputted from the active space through the output channel. The impeller includes a seat part and a hollow part.

In an embodiment, the active space is divided into a heat-absorbing space and a drainage space by the seat part, and the working medium within the heat-absorbing space and the drainage space undergoes a fluidly coupling effect through the hollow part.

In an embodiment, the impeller further includes an upper wall. The upper wall and the seat part are separated from each other. Moreover, plural partition walls are connected between the upper wall and the seat part. The drainage space is divided into plural drainage chambers by the plural partition walls.

While the working medium is transferred upwardly through the hollow part, the working medium is contacted with the upper wall and then the working medium is diverted to the drainage chambers.

In an embodiment, the impeller further includes a raised structure, which is protruded from a junction between the hollow part and the seat part in a direction toward the base. The working medium from the heat-absorbing space is guided by the raised structure so as to be collected and transferred to the drainage space.

In an embodiment, a pressurizing structure is formed on an inner surface of the raised structure.

In an embodiment, the pressurizing structure is a helical structure or a vortex structure.

In an embodiment, the seat part further includes a spoiler structure. The spoiler structure is formed on a bottom surface of the seat part and protruded in a direction toward the base.

In an embodiment, the spoiler structure includes plural centrifugal-type blades.

In an embodiment, the impeller further includes a bushing, and the bushing is sheathed around a shaft, so that the impeller is rotatable about the shaft.

In an embodiment, the shaft is installed on a fixing element, and the fixing element is installed on the base.

In an embodiment, the bushing and the seat part are connected with each other through plural ribs.

In an embodiment, a pressurizing structure is formed on a surface of a portion of the bushing within the active space.

In an embodiment, the pressurizing structure is a helical structure or a vortex structure.

In an embodiment, the hollow part is located near the bushing.

In an embodiment, an outer side of the base has a heat-absorbing surface, and a thermal conduction structure is disposed on an inner side of the base. The heat-absorbing surface is in contact with a heat source to absorb the heat. The heat is transferred to the working medium through the thermal conduction structure.

In an embodiment, the input channel is located near the thermal conduction structure. When the cooled working medium is moved across the thermal conduction structure, the cooled working medium absorbs the heat from the thermal conduction structure.

In an embodiment, the water-cooling head is connected with a heat exchanger. After the working medium is outputted from the output channel, the working medium is cooled down by the heat exchanger and then introduced into the active space through the input channel.

In accordance with another aspect of the present invention, there is provided a water-cooling head. The water-cooling head includes an active space and an impeller. The active space includes a heat-absorbing space and a drainage space. A working medium is filled in the active space. The impeller is disposed within the active space, and includes a seat part and a hollow part. The active space is divided into the heat-absorbing space and the drainage space by the seat part. The working medium within the heat-absorbing space and the drainage space undergoes a fluidly coupling effect through the hollow part.

In an embodiment, the water-cooling head further includes an input channel and an output channel. The input channel in communication with the heat-absorbing space. The output channel is in communication with the drainage space.

In an embodiment, the impeller further includes an upper wall. The upper wall and the seat part are separated from each other. Moreover, plural partition walls are connected between the upper wall and the seat part. The drainage space is divided into plural drainage chambers by the plural partition walls. While the working medium is transferred upwardly through the hollow part, the working medium is contacted with the upper wall and then the working medium is diverted to the drainage chambers.

In an embodiment, the impeller further includes a raised structure, which is protruded from a junction between the hollow part and the seat part in a direction toward the base. The working medium from the heat-absorbing space is guided by the raised structure so as to be collected and transferred to the drainage space.

In an embodiment, a pressurizing structure is formed on an inner surface of the raised structure.

In an embodiment, the pressurizing structure is a helical structure or a vortex structure.

In an embodiment, the impeller further includes a bushing, and the bushing is sheathed around a shaft, so that the impeller is rotatable about the shaft. The hollow part is located near the bushing.

In an embodiment, the seat part further includes a spoiler structure. The spoiler structure is formed on a bottom surface of the seat part and protruded in a direction facing the base.

In an embodiment, the spoiler structure includes plural centrifugal-type blades.

From the above descriptions, the structure of the impeller of the water-cooling head is specially designed to inhale and guide the working medium within an active space to flow. Consequently, the internal structure of the water-cooling head is simplified, the volume of the water-cooling head is reduced, and the heat dissipating performance of the water-cooling head is enhanced.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 2 is a schematic cross-sectional view illustrating the water-cooling head of FIG. 1A and taken along the line 2a-2a;

DETAILED DESCRIPTION OF THE PREFERRED EMBODIMENT

Figure 1A:
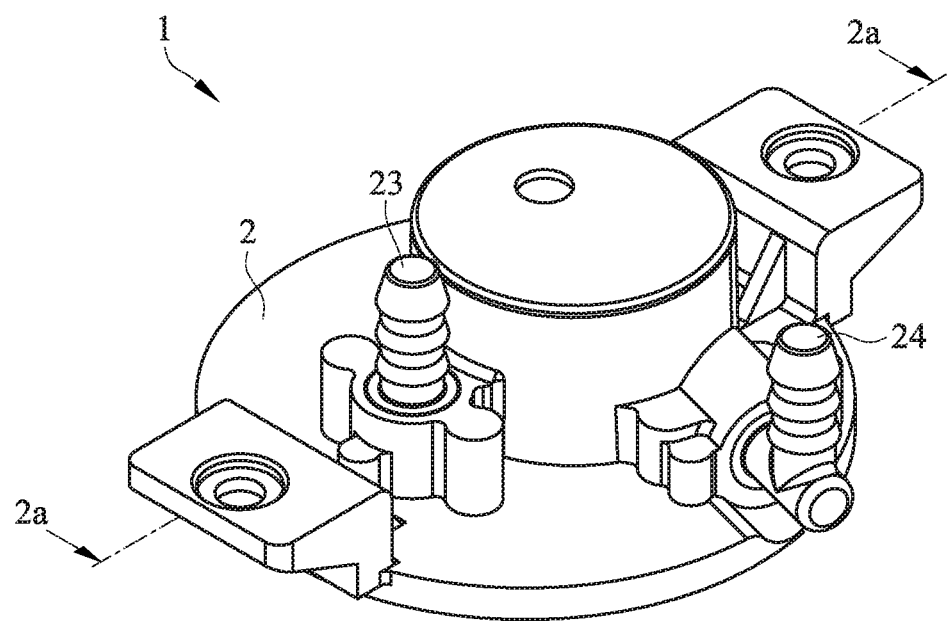
FIG. 1A is a schematic perspective view illustrating a water-cooling head according to an embodiment of the present invention.
Figure 1B:
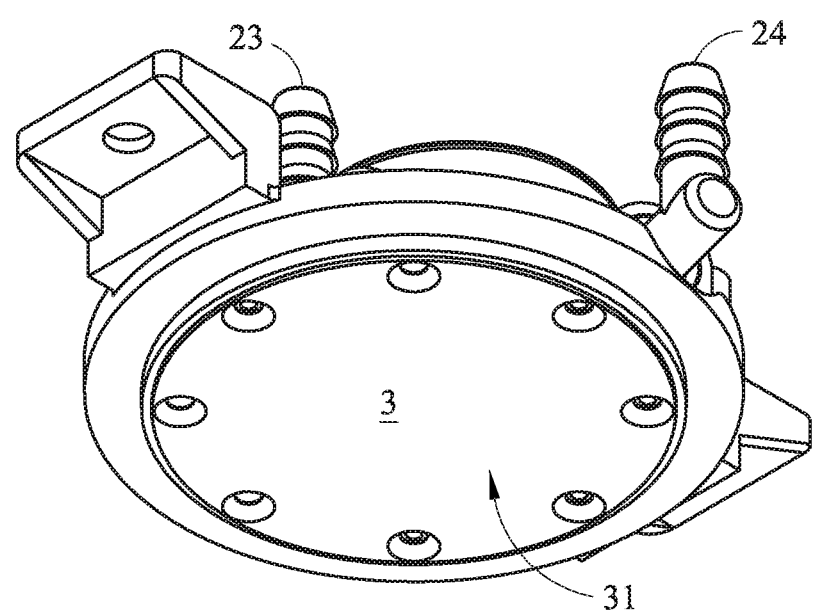
FIG. 1B is a schematic perspective view illustrating the water-cooling head according to the embodiment of the present invention and taken along another viewpoint.

The present invention provides a water-cooling head with a built-in pump. Please refer to FIGS. 1A, 1B, 2 and 3. The water-cooling head 1 comprises a casing 2, a base 3 and a pump 4. The casing 2 and the base 3 are combined together through a screwing means or any other appropriate fixing means. Consequently, an active space 5 for allowing a working medium to go through is defined by the casing 2 and the base 3 collaboratively. After the working medium is filled into the active space 5 by the user or the manufacturer, the heat dissipating function of the water-cooling head 1 is achieved.

The casing 2 comprises an input channel 21 and an output channel 22. The input channel 21 is in communication with the active space 5. The cooled working medium is introduced into the active space 5 through the input channel 21. The output channel 22 is also in communication with the active space 5. The heated working medium is outputted from the active space 5 through the output channel 22. In an embodiment, an input connector 23 and an output connector 24 are externally extended or installed on the input channel 21 and the output channel 22, respectively. The input connector 23 and the output connector 24 are vertically arranged or horizontally arranged. The arrangements of the input connector 23 and the output connector 24 are not restricted as long as they are allowed to be connected with other heat exchangers (e.g., water-cooling radiators) or pipes.

The outer side of the base 3 has a heat-absorbing surface 31. A thermal conduction structure 32 is disposed or formed on the inner side of the base 3. When the heat-absorbing surface 31 is in contact with a heat source, the heat of the heat source is absorbed by the heat-absorbing surface 31 and transferred to the thermal conduction structure 32. Since the thermal conduction structure 32 is in contact with the working medium (not shown), the heat is transferred from the thermal conduction structure 32 to the working medium. The thermal conduction structure 32 comprises skived fins, pin fins, straight fins or any other appropriate fins with irregular shapes. The types of the fins of the thermal conduction structure 32 are not restricted as long as the contact area between the fins and the working medium is increased to facilitate transferring the heat to the working medium. After the casing 2 and the base 3 are combined together through a screwing means or any other appropriate fixing means, the active space 5 for allowing the working medium to go through is defined.

Figure 2:
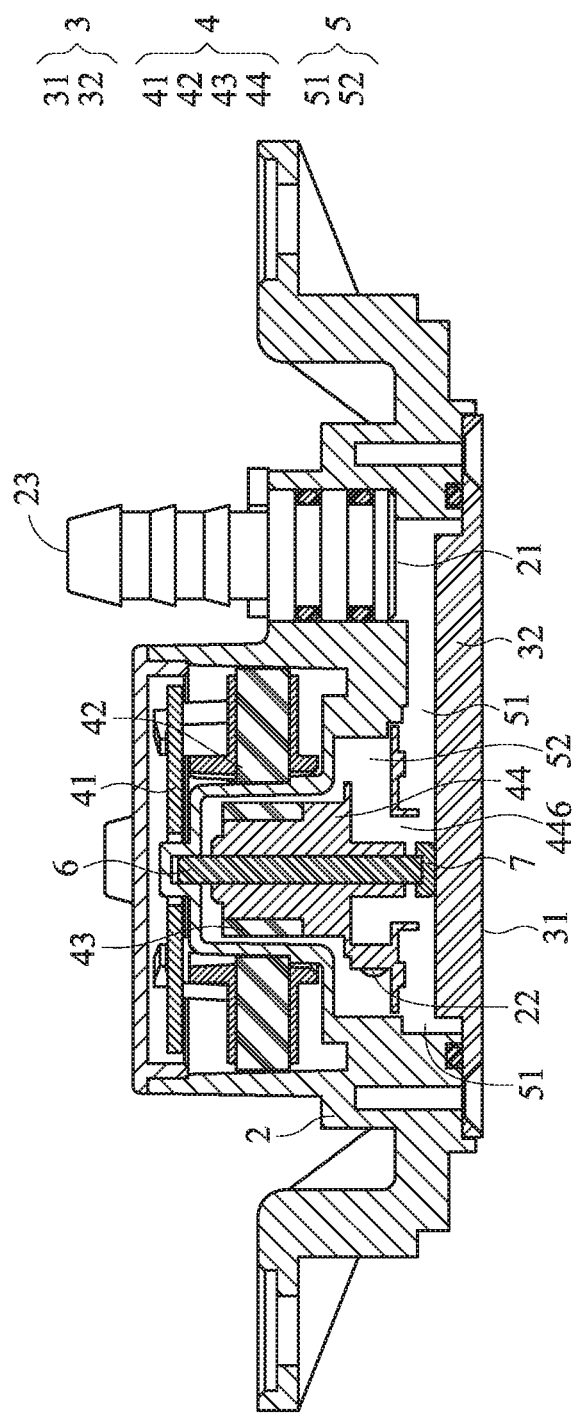
Figure 3:
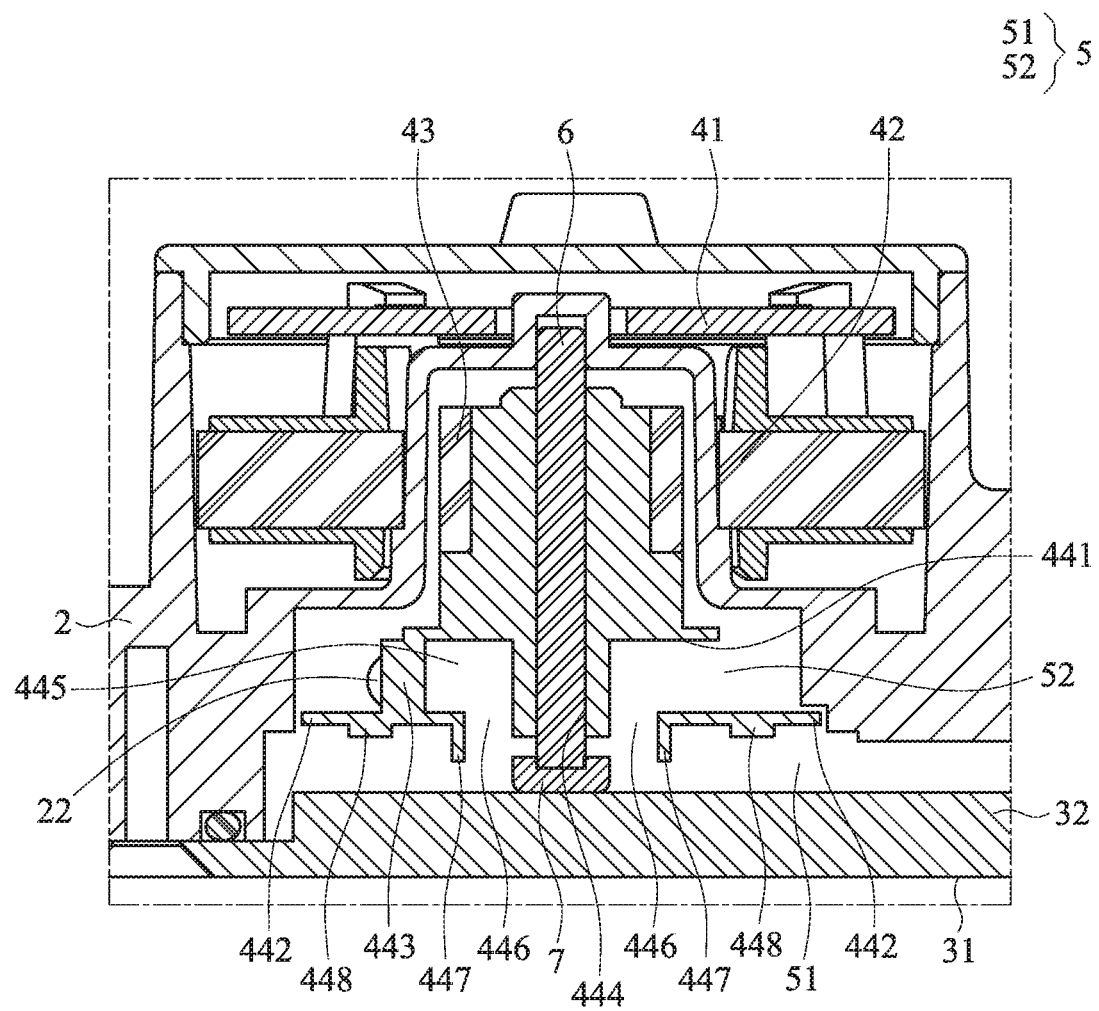
FIG. 3 is a schematic enlarged view illustrating a portion of the water-cooling head of FIG. 2.

Please refer to FIGS. 2 and 3. The pump 4 is disposed within the water-cooling head 1 and installed on the casing 2. The pump 4 comprises a circuit board 41, a first magnetic element 42, a second magnetic element 43 and an impeller 44. The circuit board 41 and the first magnetic element 42 are located outside the casing 2. The second magnetic element 43 and the impeller 44 are combined together and installed within the casing 2. That is, the combination of the second magnetic element 43 and the impeller 44 is disposed within the active space 5. The first magnetic element 42 is a silicon steel plate or a magnet. The second magnetic element 43 is a magnet. According to the interaction between the circuit board 41, the first magnetic element 42 and the second magnetic element 43, the impeller 44 is driven to guide the movement of the working medium. In addition, the water-cooling head 1 further comprises a shaft 6 and a fixing element 7. The fixing element 7 is used for installing the shaft 6. Consequently, the impeller 44 is sheathed around the shaft 6 and rotated about the shaft 6. With the assistance of the fixing element 7, the impeller 44 is not deviated or detached. After the water-cooling head 1 is assembled, the fixing element 7 is installed on the base 3. For example, the fixing element 7 is abutted against the thermal conduction structure 32 or coupled with the thermal conduction structure 32.

Please refer to FIGS. 2, 3, 4A, 4B, 5, 6 and 7 and FIGS. 8A-8D. FIG. 3 is a schematic enlarged view illustrating a portion of the water-cooling head of FIG. 2. Especially, the relationships between the impeller 44, the shaft 6, the fixing element 7, the base 3 and associated components inside the water-cooling head 1 are shown in the perspective view of FIG. 4A and the exploded view of FIG. 4B. As mentioned above, the impeller 44 within the water-cooling head 1 is stably rotated through the shaft 6 and the fixing element 7. In addition, the impeller 44 further provides a guiding function. After the working medium is introduced into the active space 5 through the input channel 21 to absorb the heat, the impeller 44 has the function of guiding the working medium to be smoothly outputted from the output channel 22.

For achieving the above function, the impeller 44 is disposed within the active space 5 and located near the output channel 22. Consequently, the working medium can be quickly guided to the output channel 22 and outputted from the active space 5. The impeller 44 mainly comprises a seat part 442 and a hollow part 446. The active space 5 is divided into a heat-absorbing space 51 and a drainage space 52 by the seat part 442. The working medium within the heat-absorbing space 51 and the drainage space 52 undergoes a fluidly coupling effect through the hollow part 446. Consequently, the working medium can be transferred from the heat-absorbing space 51 to the drainage space 52.

The impeller 44 further comprises an upper wall 441. The upper wall 441 and the seat part 442 are separated from each other. In addition, plural partition walls 443 are connected between the upper wall 441 and the seat part 442. The drainage space 52 is divided into plural drainage chambers 445 by the plural partition walls 443. While the working medium is transferred upwardly from the heat-absorbing space 51 to the drainage space 52 through the hollow part 446, the working medium is contacted with the upper wall 441 and then diverted to the drainage chambers 445. In other words, the upper wall 441 in this embodiment is a guiding mechanism that is able to change the flowing direction.

Figure 4A:
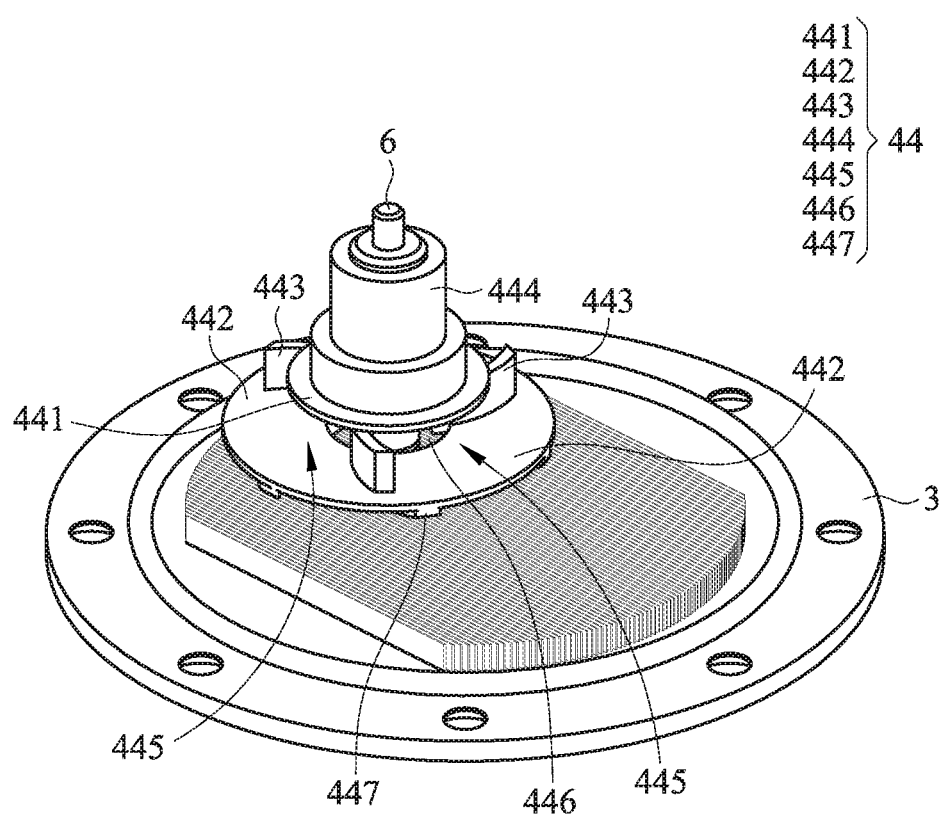
FIG. 4A is a schematic perspective view illustrating the impeller, the shaft, the fixing element and the base within the water-cooling head according to the embodiment of the present invention.
Figure 4B:
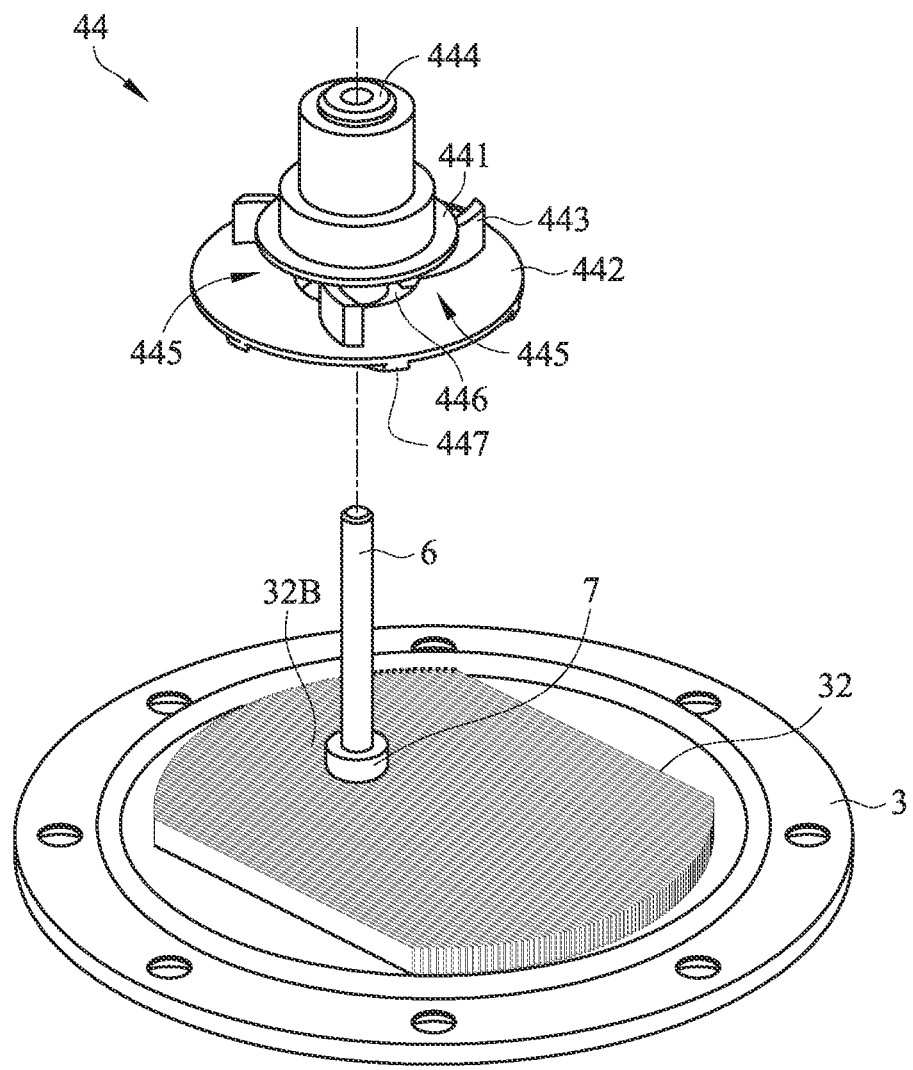
FIG. 4B is a schematic exploded view illustrating the impeller, the shaft, the fixing element and the base within the water-cooling head according to the embodiment of the present invention.
Figure 8A:
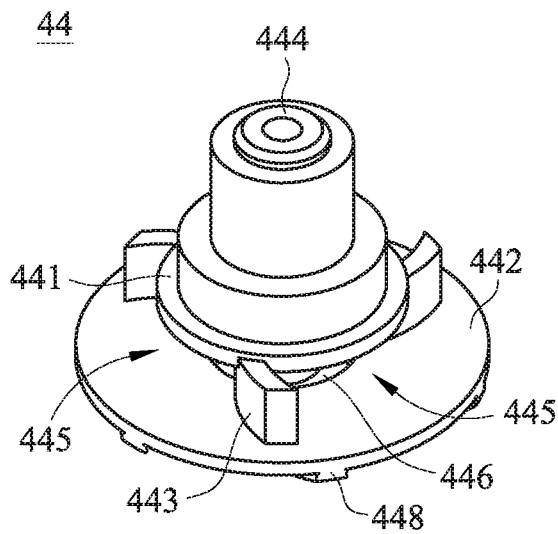
FIGS. 8A to 8D are schematic perspective views illustrating the impeller that are taken along different viewpoints.
Figure 8B:
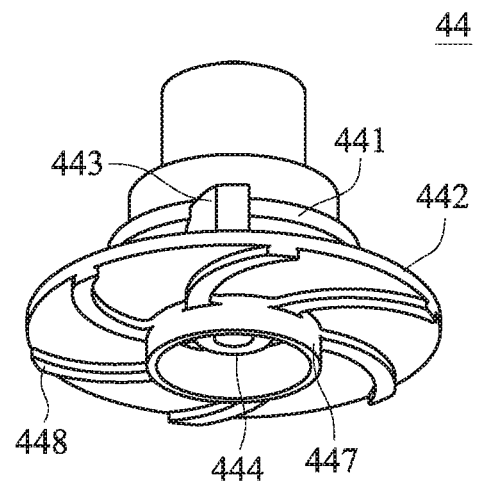
Figure 8C:
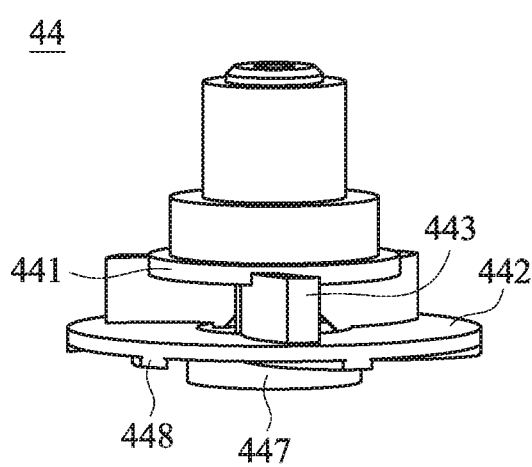
Figure 8D:
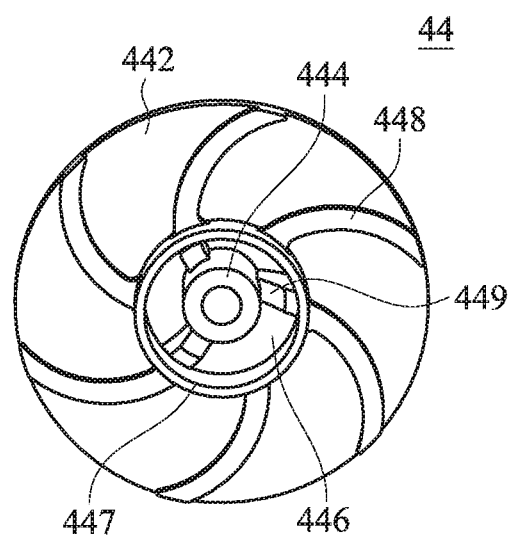

Please refer to FIGS. 4A, 4B and 8D. The impeller 44 further comprises a bushing 444. The bushing 444 is sheathed around the shaft 6. Consequently, the impeller 44 can be rotated about the shaft 6. Moreover, the bushing 444 and the seat part 442 are connected with each other through plural ribs 449. The ribs 449 are helpful to increase the structural strength. In addition, the plural drainage chambers 445 are defined by the ribs 449, seat part 442, the partition walls 443 and the upper wall 441 collaboratively.

Please refer to FIGS. 3, 5, 8D and 9B. In this embodiment, the hollow part 446 of the impeller 44 is located near the bushing 444 or arranged around the bushing 444. Consequently, the working medium from the heat-absorbing space 51 is collected and transferred through the hollow part 446 and upwardly attracted to the drainage space 52.

After the rotation of the impeller 44 is started, the working medium is attracted from the heat-absorbing space 51 to the drainage chambers 445, which are disposed within the drainage space 52. Moreover, as the drainage chambers 445 are rotated and moved across the output channel 22, the working medium is pushed into the output channel 22 and ejected out of the water-cooling head 1 in response to the centrifugal force.

In this embodiment, the upper wall 441 and the seat part 442 of the impeller 44 are perpendicular to the shaft 6 (at 90 degrees). In some other embodiments, the upper wall 441 and the seat part 442 are not perpendicular to the shaft 6. Alternatively, the upper wall and the seat part are spirally arranged. Similarly, the working medium can also be inhaled into the drainage chambers 445.

Figure 5:
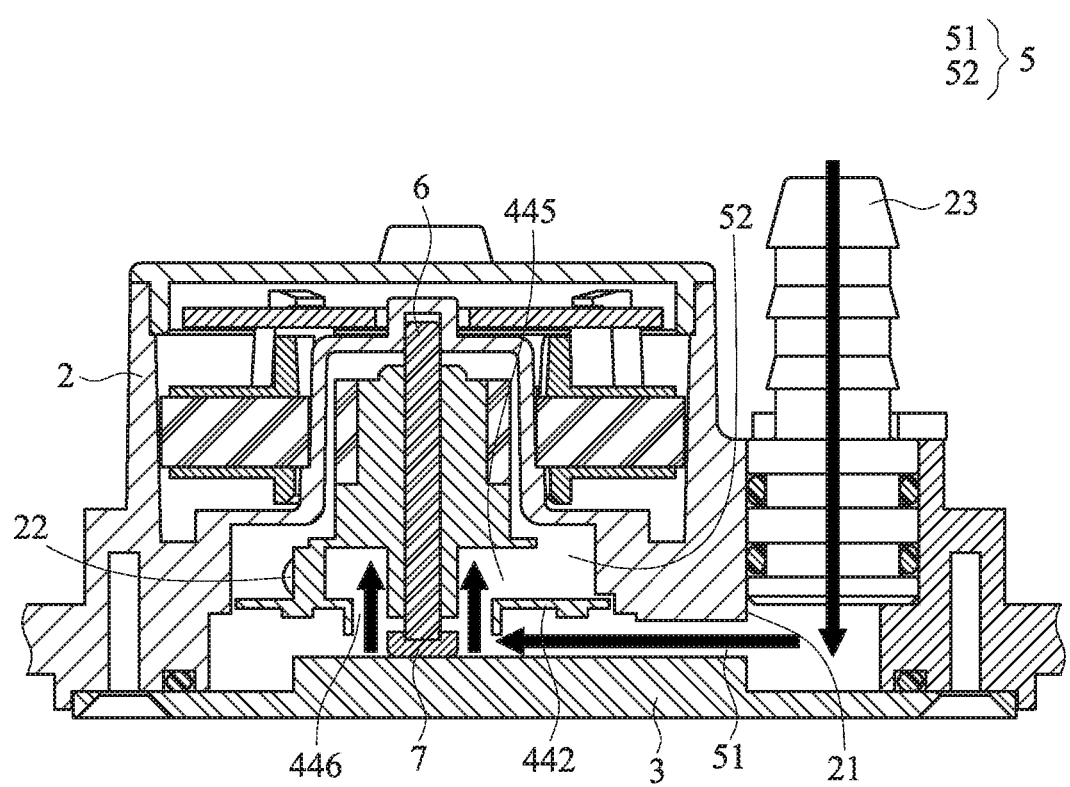
FIG. 5 is a schematic side view illustrating the path of the working medium inside the water-cooling head inhaled into the impeller through the input channel and the thermal conduction structure according to the embodiment of the present invention.
Figure 7:
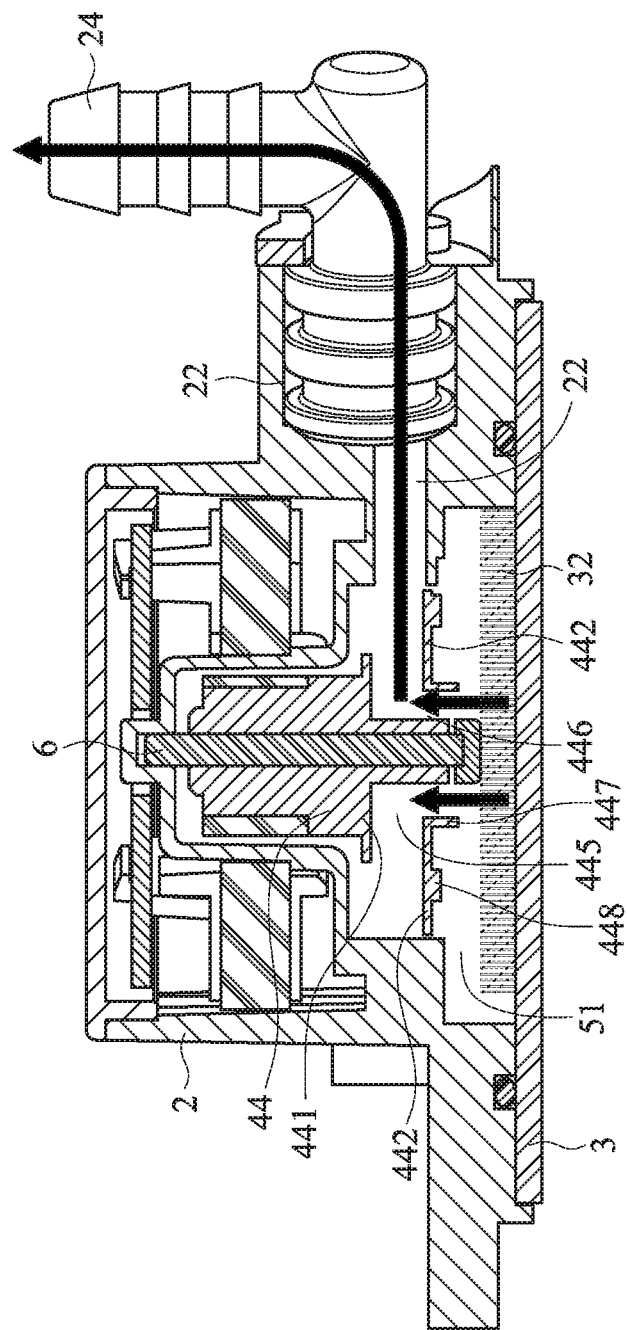
FIG. 7 is a schematic side view illustrating the path of the working medium inside the water-cooling head transferred from the thermal conduction structure to the output channel through the impeller according to the embodiment of the present invention.

Please refer to FIGS. 3, 5 and 7. In this embodiment, a raised structure 447 (i.e., a ring-shaped raised structure) is downwardly protruded from a junction between the seat part 442 and the hollow part 446 of the impeller 44 in the direction toward the base 3. The working medium from the hollow part 446 of the impeller 44 is guided upwardly by the raised structure 447 and thus inhaled into the drainage chambers 445. Consequently, the working medium from the heat-absorbing space 51 is collected and transferred to the drainage space 52.

Figure 6:
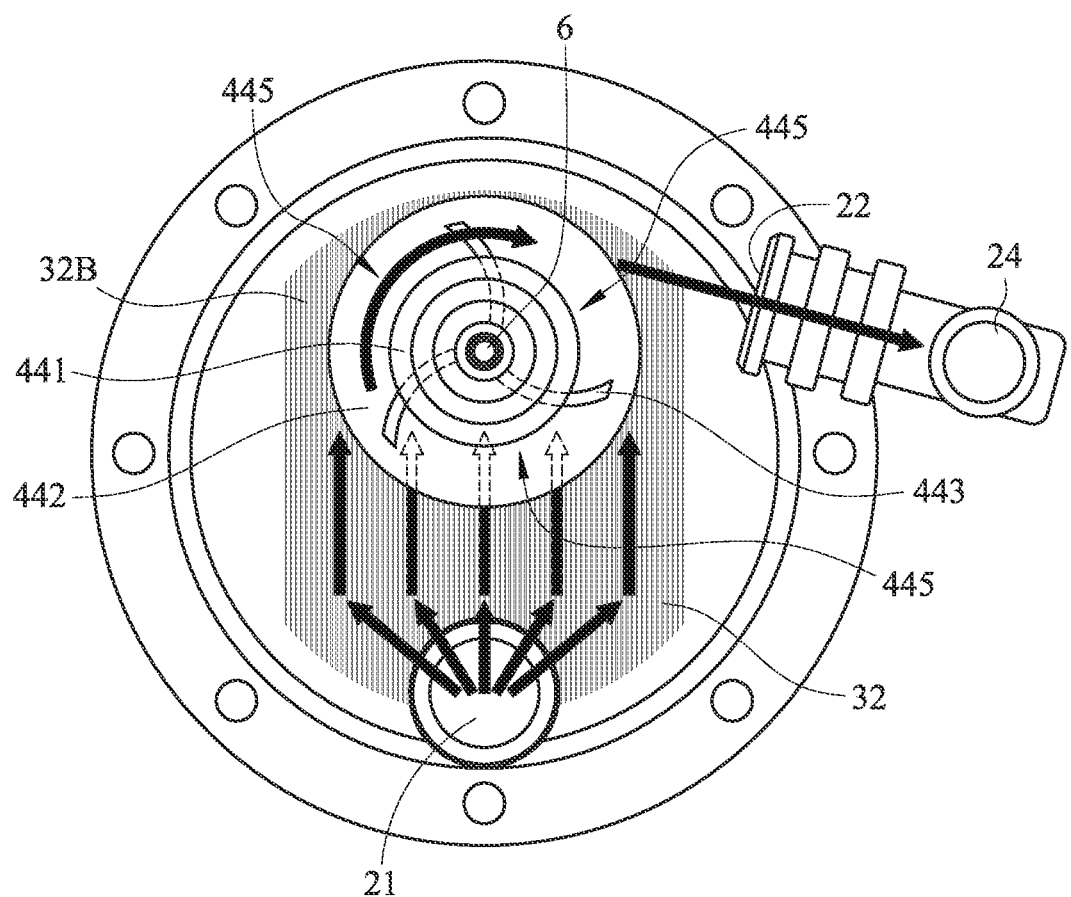
FIG. 6 is a schematic top view illustrating the path of the working medium inside the water-cooling head inhaled into the impeller through the input channel and the thermal conduction structure according to the embodiment of the present invention.

Please refer to FIGS. 4A, 4B and 6. The water-cooling head of the present invention is further equipped with a flow-guiding structure for guiding the working medium. For example, a rear side 32B of the thermal conduction structure 32 has an arc-shaped profile. When the working medium is transferred to the thermal conduction structure 32 and before the working medium is inhaled by the impeller 44, the flow-guiding structure facilitates the working medium to flow to the position under the impeller 44 along the arc-shaped channel. Then, the working medium is upwardly inhaled by the hollow part 446 of the impeller 44.

In FIGS. 4A, 4B, 5 and 7, the flowing direction of the working medium guided by the water-cooling head with the built-in pump is shown from different viewpoints and cross-sectional views. Please refer to FIG. 5. After the working medium is introduced into the active space 5 through the input channel 21, the working medium is transferred across the thermal conduction structure 32 to absorb the heat. Then, the working medium is inhaled by the hollow part 446 of the impeller 44 and transferred upwardly to the drainage chambers 445 between the upper wall 441 and the seat part 442. As can be seen in the top view of FIG. 6, the working medium is introduced into the input channel 21, moved from a front side 322A of the thermal conduction structure 32 to the rear side 322B of the thermal conduction structure 32, and inhaled into the drainage chambers 445 within the drainage space 52 through the position under the hollow part 446 of the impeller 44. When the drainage chambers 445 is rotated at an angle and contacted with the output channel 22, the working medium is correspondingly outputted or pulled out. The path of ejecting the working medium from the drainage chambers 445 in the direction toward the output channel 22 can be seen in the side view of FIG. 7.

Please refer to FIG. 6. When the arranging directions of the input connector 23 and the output connector 24 and the heat absorbing efficiency of the working medium are taken into consideration, the thermal conduction structure 32 and the impeller 44 are not coaxial. That is, the thermal conduction structure 32 and the impeller 44 are in an eccentric arrangement. Consequently, the heat transfer efficiency is enhanced.

Please refer to FIGS. 8B and 8D. In this embodiment, the water-cooling head 1 is further equipped with a spoiler structure 448. The spoiler structure 448 is formed on a bottom surface of the seat part 442 and protruded in the direction toward the heat-absorbing space 51. As shown in FIGS. 8B and 8D, the spoiler structure 448 comprises plural centrifugal-type blades. It is noted that the example of the spoiler structure is not restricted and may be varied according to the practical requirements.

Figure 9A:
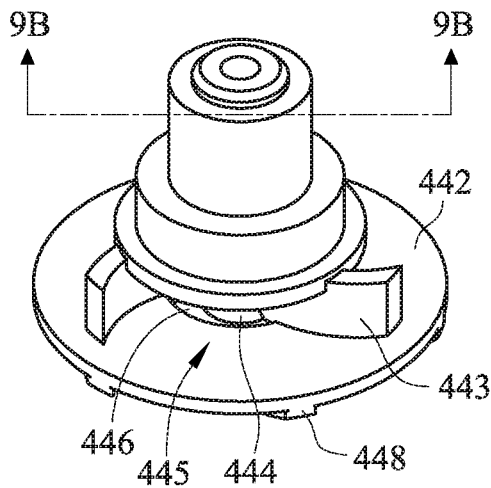
FIG. 9A is a schematic perspective view of the impeller of the water-cooling head according to the embodiment of the present invention.
Figure 9B:
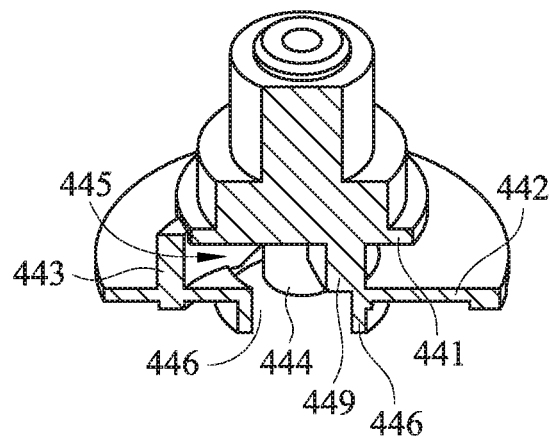
FIG. 9B is a schematic cutaway view of the impeller as shown in FIG. 9A.

FIGS. 9A and 9B are schematic perspective view and cutaway view of the impeller of the water-cooling head according to the embodiment of the present invention. After the working medium is inhaled through the hollow part 446 of the impeller 44 and contacted with the upper wall 441, the working medium is diverted to the drainage chambers 445. The associated structures are shown in the drawings.

Figure 9C:
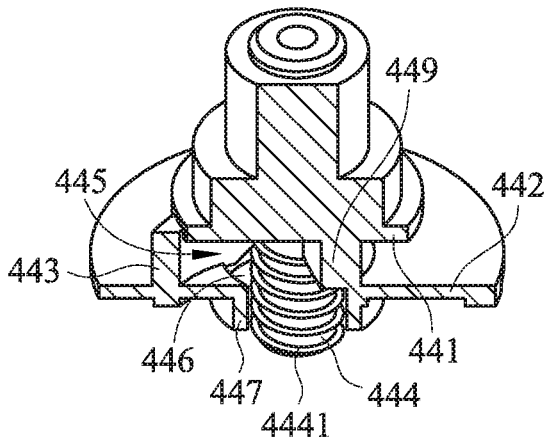
FIG. 9C is a schematic perspective view illustrating a variant example of the impeller, in which a helical structure is formed on the surface of the bushing of the impeller.

In the above embodiments, the portion of the bushing 444 within the active space 5 has no additional structure on the surface thereof. It is noted that numerous modifications and alterations may be made while retaining the teachings of the invention. For example, in FIG. 9C, a pressurizing structure such as a helical structure 4441 or a vortex structure (not shown) is formed on the surface of the bushing 444. Due to the pressuring structure, the working medium under the impeller 44 can be upwardly and rotatably inhaled into the drainage chambers 445. Consequently, the capability of impeller 44 to inhale the working medium is enhanced.

Figure 9D:
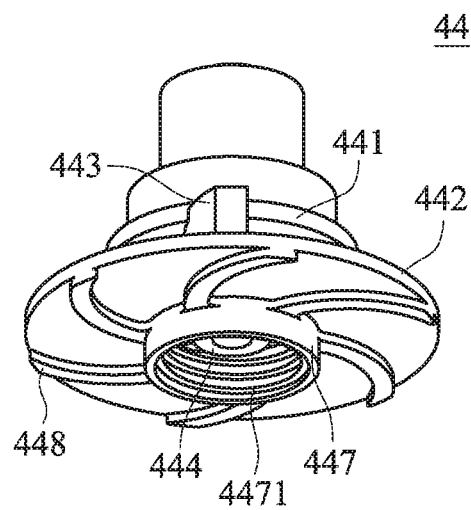
FIG. 9D is a schematic perspective view illustrating another variant example of the impeller, in which a helical structure is formed on the inner surface of the raised structure of the impeller.

The perspective views of two examples of the impeller are shown in FIGS. 8B and 9D. In the impeller of FIG. 8D, the inner surface of the raised structure 447 is a flat surface without any additional structure. In the variant example of FIG. 9D, a pressurizing structure (not shown) such as a helical structure 4471 or a vortex structure is formed on the inner surface of the raised structure 447 (i.e., the surface facing the bushing). Due to the pressuring structure, the working medium under the impeller 44 can be upwardly and rotat- ably inhaled into the drainage chambers 445. Consequently, the capability of impeller 44 to inhale the working medium is enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. A water-cooling head, comprising:
a casing;
a base, wherein an active space is defined by the base and the casing collaboratively, a working medium is filled in the active space, and a heat absorbed by the base is transferred to the working medium;
an input channel in communication with the active space, wherein after the working medium is cooled, the working medium is introduced into the active space through the input channel;
an output channel in communication with the active space, wherein after the working medium absorbs the heat, the working medium is outputted from the active space through the output channel; and
a pump installed on the casing, and comprising an impeller, wherein the impeller is disposed within the active space and located near the output channel, and the impeller is driven to guide the working medium to be outputted from the active space through the output channel, wherein the impeller comprises a seat part, a hollow part, and a raised structure, the raised structure is protruded from a junction between the hollow part and the seat part in a direction toward the base, wherein the active space is divided into a heat-absorbing space and a drainage space by the seat part, the working medium within the heat-absorbing space and the drainage space undergoes a fluidly coupling effect through the hollow part.

2. The water-cooling head according to claim 1, wherein the impeller further comprises an upper wall, wherein the upper wall and the seat part are separated from each other, plural partition walls are connected between the upper wall and the seat part, and the drainage space is divided into plural drainage chambers by the plural partition walls.

3. The water-cooling head according to claim 2, wherein while the working medium is transferred upwardly through the hollow part, the working medium is contacted with the upper wall and then the working medium is diverted to the drainage chambers.

4. The water-cooling head according to claim 1, wherein the working medium from the heat-absorbing space is guided by the raised structure so as to be collected and transferred to the drainage space.

5. The water-cooling head according to claim 4, wherein a pressurizing structure is formed on an inner surface of the raised structure.

6. The water-cooling head according to claim 5, wherein the pressurizing structure is a helical structure or a vortex structure.

7. The water-cooling head according to claim 1, wherein the seat part further comprises a spoiler structure, wherein the spoiler structure is formed on a bottom surface of the seat part and protruded in a direction toward the base.

8. The water-cooling head according to claim 7, wherein the spoiler structure comprises plural centrifugal-type blades.

9. The water-cooling head according to claim 1, wherein the impeller further comprises a bushing, and the bushing is sheathed around a shaft, so that the impeller is rotatable about the shaft.

10. The water-cooling head according to claim 9, wherein the shaft is installed on a fixing element, and the fixing element is installed on the base.

11. The water-cooling head according to claim 9, wherein the bushing and the seat part are connected with each other through plural ribs.

12. The water-cooling head according to claim 9, wherein a pressurizing structure is formed on a surface of a portion of the bushing within the active space.

13. The water-cooling head according to claim 12, wherein the pressurizing structure is a helical structure or a vortex structure.

14. The water-cooling head according to claim 9, wherein the hollow part is located near the bushing.

15. The water-cooling head according to claim 1, wherein an outer side of the base has a heat-absorbing surface, and a thermal conduction structure is disposed on an inner side of the base, wherein the heat is transferred to the working medium through the thermal conduction structure.

16. The water-cooling head according to claim 15, wherein the input channel is located near the thermal conduction structure, wherein when the cooled working medium is moved across the thermal conduction structure, the cooled working medium absorbs the heat from the thermal conduction structure.

17. A water-cooling head, comprising:
an active space comprising a heat-absorbing space and a drainage space, wherein a working medium is filled in the active space; and
an impeller disposed within the active space, and comprising a seat part, a hollow part, and a raised structure, the raised structure being protruded from a junction between the hollow part and the seat part in a direction toward the base, wherein the active space is divided into the heat-absorbing space and the drainage space by the seat part, the working medium within the heat-absorbing space and the drainage space undergoes a fluidly coupling effect through the hollow part.

18. The water-cooling head according to claim 17, wherein the water-cooling head further comprises an input channel and an output channel, wherein the input channel in communication with the heat-absorbing space, and the output channel is in communication with the drainage space.

19. The water-cooling head according to claim 17, wherein the impeller further comprises an upper wall, wherein the upper wall and the seat part are separated from each other, plural partition walls are connected between the upper wall and the seat part, and the drainage space is divided into plural drainage chambers by the plural partition walls, wherein while the working medium is transferred upwardly through the hollow part, the working medium is contacted with the upper wall and then the working medium is diverted to the drainage chambers.

20. The water-cooling head according to claim 17, wherein the working medium from the heat-absorbing space is guided by the raised structure so as to be collected and transferred to the drainage space.

21. The water-cooling head according to claim 20, wherein a pressurizing structure is formed on an inner surface of the raised structure.

22. The water-cooling head according to claim 21, wherein the pressurizing structure is a helical structure or a vortex structure.

23. The water-cooling head according to claim 17, wherein the impeller further comprises a bushing, and the bushing is sheathed around a shaft, so that the impeller is rotatable about the shaft, wherein the hollow part is located near the bushing.

24. The water-cooling head according to claim 17, wherein the seat part further comprises a spoiler structure, wherein the spoiler structure is formed on a bottom surface of the seat part and protruded in a direction facing the base.

25. The water-cooling head according to claim 24, wherein the spoiler structure comprises plural centrifugal-type blades.

* * * * *